United States Patent
Lee et al.

(10) Patent No.: US 7,545,096 B2
(45) Date of Patent: Jun. 9, 2009

(54) TRANS-REFLECTIVE ORGANIC ELECTROLUMINESCENT PANEL AND METHOD OF FABRICATING THE SAME

(75) Inventors: Chung-Chun Lee, Lunbei Township, Yunlin County (TW); Ming-Chang Shih, Yuanlin Township, Changhua County (TW)

(73) Assignee: Au Optronics Corp., Hsin-Chu (TW)

( * ) Notice: Subject to any disclaimer, the term of this patent is extended or adjusted under 35 U.S.C. 154(b) by 577 days.

(21) Appl. No.: 11/327,781

(22) Filed: Jan. 6, 2006

(65) Prior Publication Data

US 2007/0075634 A1    Apr. 5, 2007

(30) Foreign Application Priority Data

Sep. 30, 2005    (TW) .............................. 94134273 A

(51) Int. Cl.
*H01J 1/62*    (2006.01)
*H01J 63/04*    (2006.01)

(52) U.S. Cl. ...................................... 313/506
(58) Field of Classification Search ........................ None
See application file for complete search history.

(56) References Cited

U.S. PATENT DOCUMENTS

| 6,639,250 B1 | 10/2003 | Shimoda et al. ............... 257/98 |
| 6,787,796 B2 * | 9/2004 | Do et al. ......................... 257/40 |
| 6,822,257 B2 * | 11/2004 | Lee et al. ........................ 257/40 |
| 7,375,463 B2 * | 5/2008 | Uemura et al. ............... 313/504 |
| 2004/0160172 A1 * | 8/2004 | Tyan et al. .................... 313/506 |
| 2005/0067954 A1 * | 3/2005 | Nishikawa et al. .......... 313/506 |

FOREIGN PATENT DOCUMENTS

CN    1604703    4/2005

* cited by examiner

*Primary Examiner*—Toan Ton
*Assistant Examiner*—Britt Hanley
(74) *Attorney, Agent, or Firm*—Thomas, Kayden, Horstemeyer & Risley

(57) ABSTRACT

A trans-reflective organic electroluminescent panel comprises a substrate, several controlling components and displaying regions formed on the substrate. The displaying regions are electrically connected to the controlling components, and each display region has a trans-reflective organic electroluminescent device (OELD). The trans-reflective OELD at least comprises a transparent electrode formed on the substrate, a light emitting layer formed above the transparent electrode, a reflective electrode formed above the light emitting layer and a semi-reflecting layer. Light generated from the light emitting layer emits toward the transparent electrode to form a light path, and the semi-reflecting layer is disposed in the middle of the light path. Also, a proper proportion of the area of the semi-reflecting layer to the area of the transparent electrode is determined for improving the luminescence and color performances of the trans-reflective organic electroluminescent panel.

18 Claims, 6 Drawing Sheets

TRANS-REFLECTIVE ORGANIC ELECTROLUMINESCENT PANEL AND METHOD OF FABRICATING THE SAME

This application claims the benefit of Taiwan application Ser. No. 094134273, filed Sep. 30, 2005, the subject matter of which is incorporated herein by reference.

BACKGROUND OF THE INVENTION

1. Field of the Invention

The invention relates in general to a trans-reflective organic electroluminescent panel and method of fabricating the same, and more particularly to the trans-reflective organic electroluminescent panel having an appropriate viewing angle, and improved luminescence efficiency and chromaticity.

2. Description of the Related Art

Use of organic electroluminescence device in the flat panel displays possesses several competitive advantages, such as self illumination, high brightness, wide viewing angle, vivid contrast, quick response, broad range of operating temperature, high luminous efficiency and uncomplicated process of fabrication. Thus, the organic electroluminescence device represents a promising technology for display applications and has receives the worldwide attention in the recent years.

The typical structure of organic electroluminescence device is mainly constructed by interposing an organic light emitting layer between an anode and a cathode. A hole transport layer (HTL) is interposed between the anode and the organic light emitting layer. An electron transport layer (ETL) is interposed between the cathode and the organic light emitting layer. Also, a hole injection layer (HIL) could be interposed between the anode and the hole transport layer. This laminated structure of OELD facilitates the electron flow from the cathode to the anode.

FIG. 1A illustrates a conventional non-microcavity organic electroluminescence device. The arrow of FIG. 1A denotes the light emitting direction. For the most structures of the organic electroluminescence devices, the anode 11 is made of the material with high transparency. Practically, a glass substrate 112 coated with a transparent and conductive indium tin oxide (ITO) layer 114 could function as the anode 11. The cathode 19 is made of the material with high reflectivity, such as the metallic stack including a lithium fluoride (LiF) layer and an aluminum (Al) layer. Also, a hole transport layer (HTL) 13, a light emitting layer 15 and an electron transport layer (ETL) 17 are formed orderly between the anode 11 and the cathode 19. However, the structure having the transparent and reflective electrodes, as shown in FIG. 1A, cannot generate the light disturbance inside the organic electroluminescence device (i.e. having no microcavity effect); the luminescence output and color saturation of the structure of FIG. 1A are inferior to that of the microcavity structure. Please refer FIG. 1B, which shows the emission spectra of the conventional organic electroluminescence device of FIG. 1A.

FIG. 2A illustrates a conventional microcavity organic electroluminescence device. The arrow of FIG. 2A denotes the light emitting direction. In a microcavity organic electroluminescence device of FIG. 2A, a semi-reflecting layer 21 is disposed between the glass substrate 112 and the ITO layer 114. In most the reported cases, the semi-reflecting layer 21 (as a light transmissive reflector) could be a quarter wave stack which is a multi-layer stack of alternating high index and low index dielectric thin films, each one a quarter wavelength thick. It can be turned to have high reflectance, low transmittance, and low absorption over a desired range of wavelengths. As shown in FIG. 2A, the semi-reflecting layer 21 comprises three titanium dioxide (TiO2) layers 211 and three silicon dioxide (SiO2) layers 213 (of the form TiO2:SiO2:TiO2:SiO2:TiO2:SiO2). Also, the cathode 19 of FIG. 2A is made of the material with high reflectivity. When the photons are emitted from the light emitting layer 15, some of them pass through the glass substrate 112 directly, and the others are reflected between the cathode 19 and the semi-reflecting layer 21. Since those reflective photons are interfered constructively or destructively, the light emission at a certain range of wavelength is greatly increased, and the light emission at the other range of wavelength is greatly decreased. FIG. 2B shows the emission spectra of the conventional microcavity organic electroluminescence device of FIG. 2A. The microcavity organic electroluminescence device indeed enhances the luminescence output and narrows the emission bandwidth (full-width-half-max, FWHM) when compared with the non-microcavity organic electroluminescence device (i.e. FIG. 1A). This microcavity effect also narrows the viewing angles of the organic electroluminescence device. In the top-emission device, the light interference becomes more serious because of the semi-transparent electrodes used as the anode and the cathode; thus, the microcavity effect is emphasized.

According to the description above, although the non-microcavity organic electroluminescence device presents a wider viewing angle (e.g. the device of FIG. 1B has the broader FWHM), it suffers from the lower luminescence output and unsaturated chromaticity. On the contrary, the microcavity organic electroluminescence device yields higher luminescence output and saturated chromaticity, but suffers from the very narrow viewing angle (e.g. the device of FIG. 2B presents the narrower FWHM) and color shift.

SUMMARY OF THE INVENTION

It is therefore an object of the present invention to provide a trans-reflective organic electroluminescent panel and method of fabricating the same. A proper proportion of the area of the semi-reflecting layer to the area of the transparent electrode is determined and configured to improve the performance of the trans-reflective organic electroluminescent panel, such as to enhance the luminescence efficiency and the color purity (or chromaticity) within an appropriate range of viewing angle.

The present invention achieves the objects by providing a trans-reflective organic electroluminescent panel, comprising a substrate, a plurality of controlling components and a plurality of displaying regions formed on the substrate. The displaying regions are electrically connected to the controlling components, and each displaying region includes an organic electroluminescent device. The organic electroluminescent device comprises a transparent electrode formed on the substrate; a light emitting layer formed above the transparent electrode, for generating light toward the transparent electrode; a reflective electrode formed above the light emitting layer; and a semi-reflecting layer disposed in a path of the light. Also, a certain proportion of an area of the semi-reflecting layer to an area of the transparent electrode is determined.

The present invention achieves the objects by providing a method of fabricating a trans-reflective organic electroluminescent panel, comprising the steps of:

providing a substrate;

forming a plurality of controlling components on the substrate;

forming a plurality of displaying regions on the substrate, and the displaying regions electrically connected to the controlling components, and each displaying region including an organic electroluminescent device, steps of fabricating the organic electroluminescent device comprising:

forming a transparent electrode on the substrate;

forming a light emitting layer above the transparent electrode, for generating light toward the transparent electrode;

forming a reflective electrode above the light emitting layer; and disposing a semi-reflecting layer in a path of light, and a certain proportion of an area of the semi-reflecting layer to an area of the transparent electrode being determined.

Other objects, features, and advantages of the present invention will become apparent from the following detailed description of the preferred but non-limiting embodiment. The following description is made with reference to the accompanying drawings.

DETAILED DESCRIPTION OF THE INVENTION

In the present invention, a proper proportion of the area of the semi-reflecting layer to the area of the transparent electrode is determined and configured to improve the performance of the trans-reflective organic electroluminescent panel, such as to enhance the luminescence efficiency and the color purity (or chromaticity) within an appropriate range of viewing angle.

A preferred embodiment disclosed herein is used for illustrating the present invention, but not for limiting the scope of the present invention. Additionally, the drawings used for illustrating the embodiments of the present invention only show the major characteristic parts in order to avoid obscuring the present invention. Accordingly, the specification and the drawings are to be regard as an illustrative sense rather than a restrictive sense.

Figure 1A:
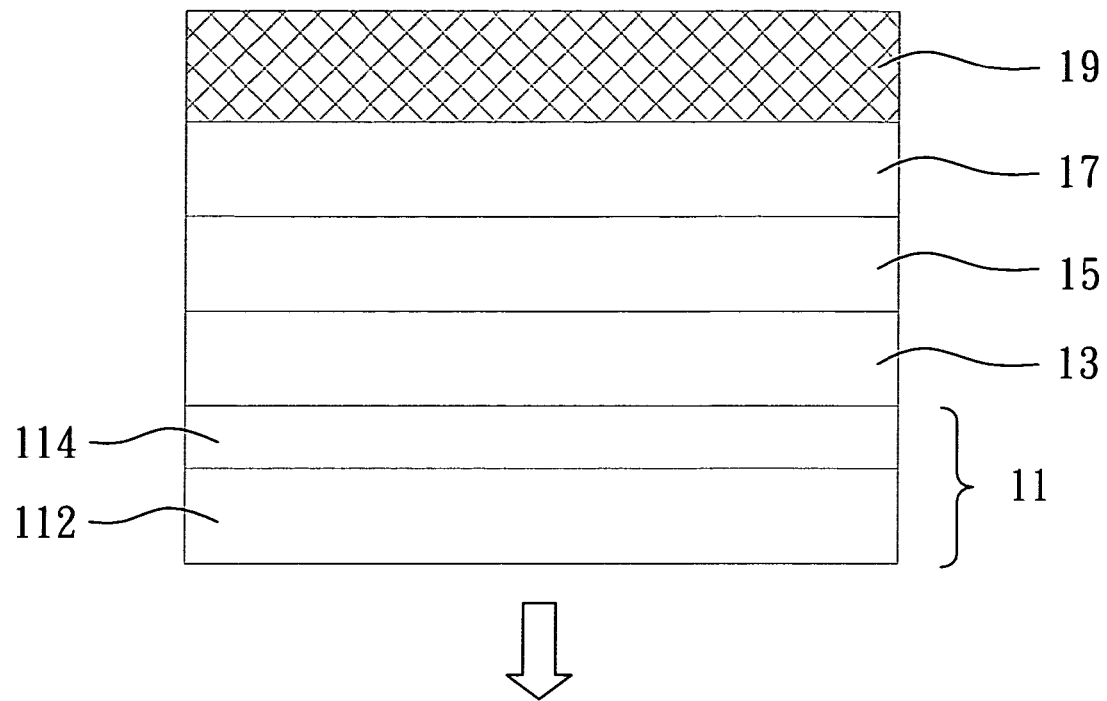
FIG. 1A (related art) illustrates a conventional non-microcavity organic electroluminescence device.
Figure 1B:
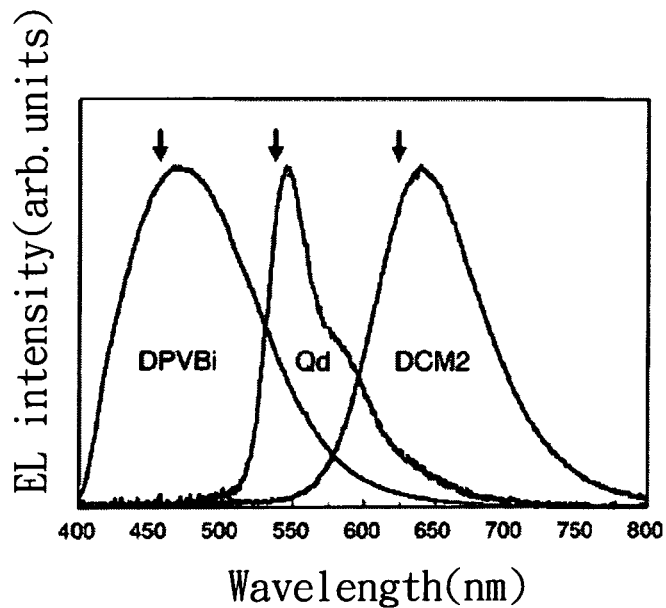
FIG. 1B (related art) shows the emission spectra of the conventional organic electroluminescence device of FIG. 1A.
Figure 2A:
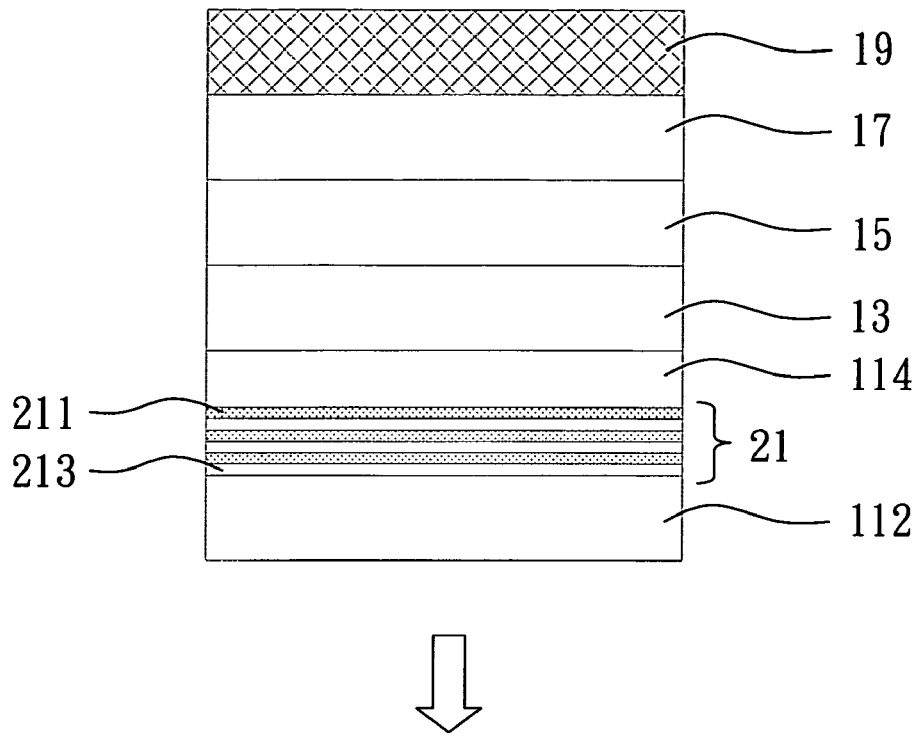
FIG. 2A (related art) illustrates a conventional microcavity organic electroluminescence device.
Figure 2B:
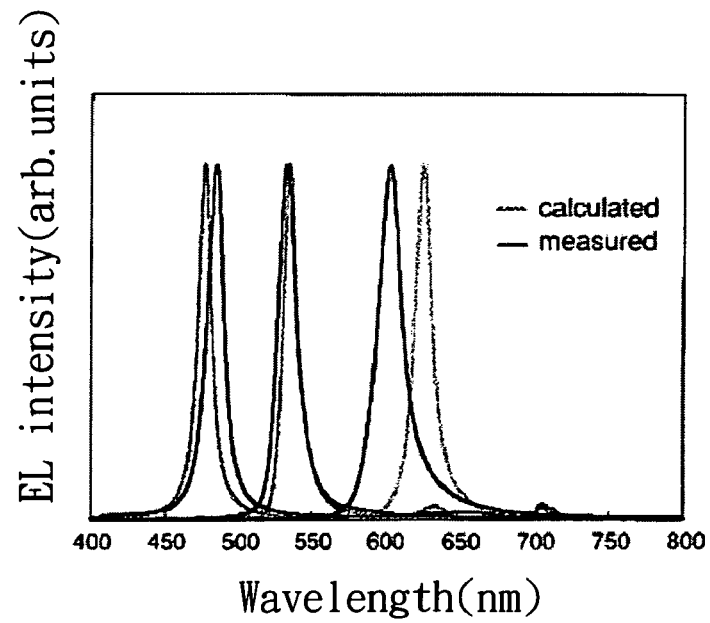
FIG. 2B (related art) shows the emission spectra of the conventional microcavity organic electroluminescence device of FIG. 2A.
Figure 3:
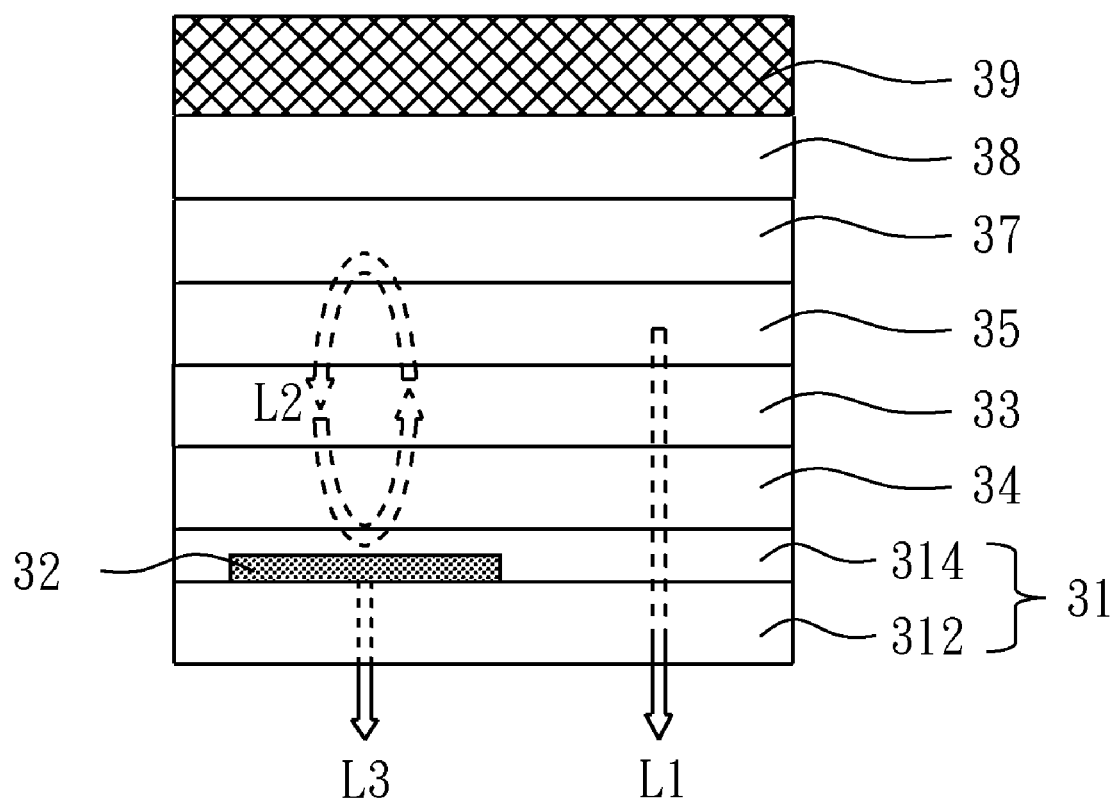
FIG. 3 illustrates a microcavity organic electroluminescence device according to the embodiment of the present invention.

FIG. 3 illustrates a microcavity organic electroluminescence device according to the. embodiment of the present invention. As shown in FIG. 3, the microcavity organic electroluminescence device at least comprises a transparent electrode (as an anode) 31, a semi-reflecting layer 32, a light emitting layer 35 and a reflective electrode (as a cathode) 39. Practically, the transparent electrode 31 can be fabricated by coating a transparent and conductive indium tin oxide (ITO) layer 314 on a glass substrate 312. The reflective electrode 39, made of the material with high reflectivity, can be the metallic stack including a lithium fluoride (LiF) layer and an aluminum (Al) layer. Light generated from the light emitting layer 35 emits toward the transparent electrode 31 to form a light path. In this embodiment, a hole transport layer (HTL) 33 is disposed between the light emitting layer 35 and the transparent electrode 31; an electron transport layer (ETL) 37 is disposed between the reflective electrode 39 and the light emitting layer 35. Additionally, a hole injection layer (HIL) 34 could be further disposed between the transparent electrode 31 and the hole transport layer 33; an electron injection layer (EIL) 38 could be further disposed between the reflective electrode 39 and the electron transport layer 37.

It is noted that the semi-reflecting layer 32 is disposed in the middle of the light path; for example, disposed between the light emitting layer 35 and the glass substrate 312 as shown in FIG. 3. Also, a proper proportion of the area of the semi-reflecting layer to the area of the transparent electrode is determined at a certain range, such as a range of about 20% to about 80%. The semi-reflecting layer 32 can be a multi-layer stack of metallic thin films such as the silver and/or aluminum films. The light (generated from the light emitting layer 35) is able to directly pass through the transparent electrode 31, as depicted by the arrow L1. When the light reaches the semi-reflecting layer 32, some of the photons are resonated to cause the microcavity effect as depicted by the arrow L2, and some photons pass through the semi-reflecting layer 32 as depicted by the arrow L3. The microcavity effect improves the luminescence output and the chromaticity. The optimum performance of the microcavity organic electroluminescent device is achieved by adjusting the proportion of the area of the semi-reflecting layer 32 to the area of the transparent electrode 31. The adjustment (i.e. the area ratio or pattern of the semi-reflecting layer 32) could be optionally changed based on the requirements of the applied displays.

In the practical application, a substrate of the applied display comprises a plurality of controlling components (such as the thin film transistors) and displaying regions (i.e. the pixels consisting of the R, G, B sub-pixels). The displaying regions are electrically connected to the controlling components, and each displaying region comprises a microcavity organic electroluminescent device as shown in FIG. 3.

Figure 4A:
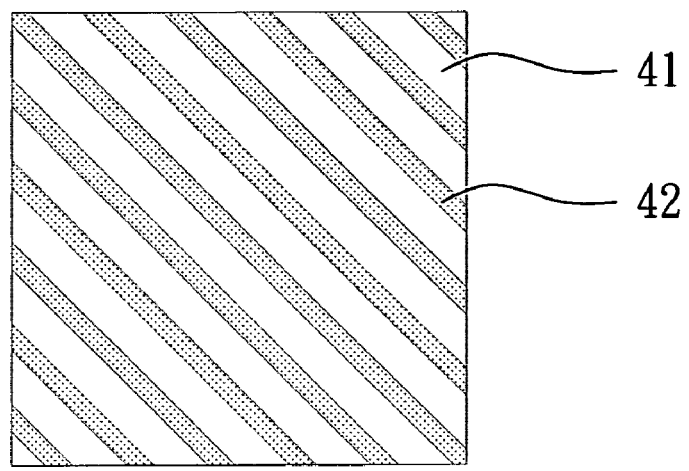
FIG. 4A~FIG. 4F illustrate six patterns formed by the semi-reflecting layer and the transparent electrode at a certain area proportion in a sub-pixel.
Figure 4B:
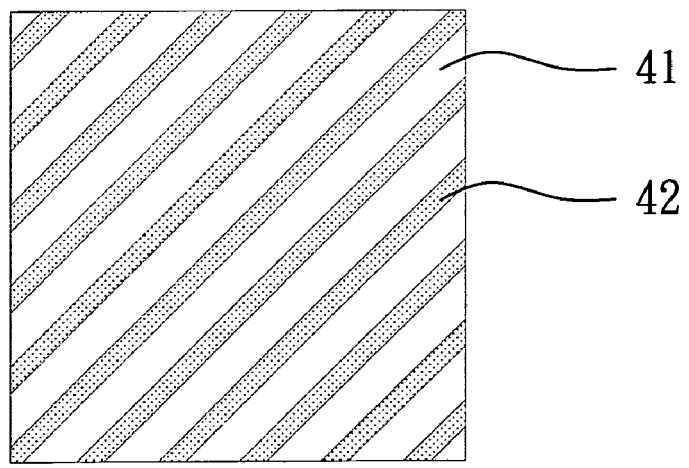
Figure 4C:
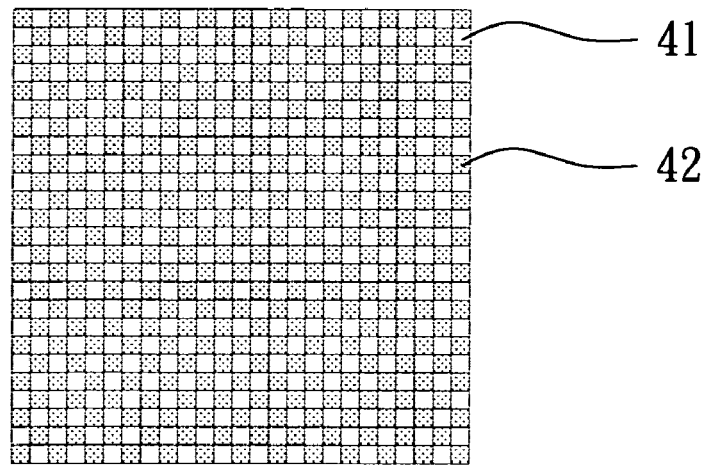
Figure 4D:
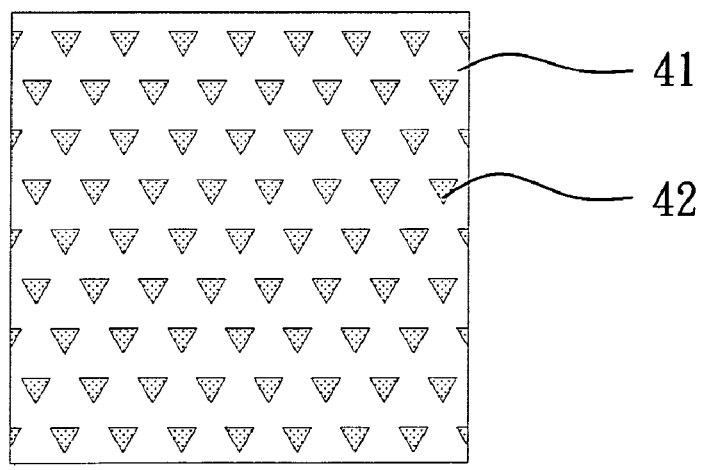
Figure 4E:
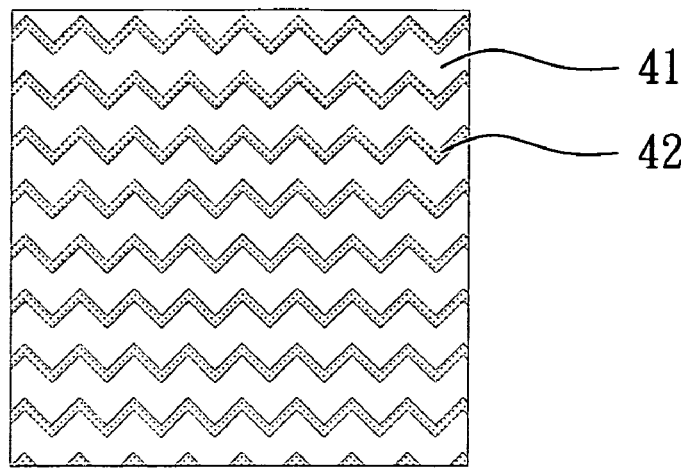
Figure 4F:
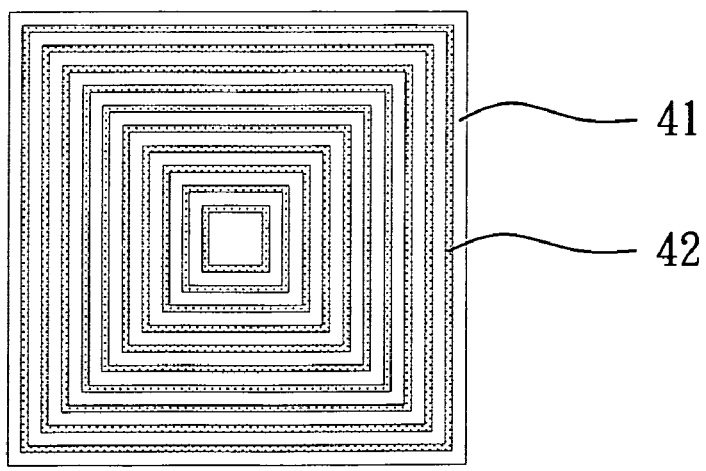

Moreover, the pattern and the position of the semi-reflecting layer 32 could be optionally determined, and are not limited in the present invention. After a certain proportion of the area of the semi-reflecting layer 32 to the area of the transparent electrode 31 is determined, a specific pattern formed by the semi-reflecting layer 32 and the transparent electrode 31 can be further figured according to the requirements of the practical application. FIG. 4A~FIG. 4F illustrate six patterns formed by the semi-reflecting layer and the transparent electrode at a certain area proportion in a sub-pixel. In FIG. 4A~FIG. 4F, the blank region (numbered as 41) represents the portion of the transparent electrode, and the dotted region (numbered as 42) represents the portion of the semi-reflecting layer. As shown in FIG. 4A and FIG. 4B, the transparent electrode 41 and the semi-reflecting layer 42 have a pattern of slanting stripes. In FIG. 4C, the figure formed by the transparent electrode 41 and the semi-reflecting layer presents a checked pattern. In FIG. 4D, the figure formed by the transparent electrode 41 and the semi-reflecting layer presents an irregular dotted pattern. In FIG. 4E, the figure formed by the transparent electrode 41 and the semi-reflecting layer presents a wave-shaped pattern. In FIG. 4F, the transparent electrode 41 and the semi-reflecting layer are in a pattern of the concentric frames. It is of course understood that other configurations (e.g. the concentric circles, the spider web and the like) beside the patterns of FIG. 4A~FIG. 4F are also applicable in the practical conditions.

Additionally, the real position of the semi-reflecting layer could be optionally altered in the practical fabrication, and not limited in the depicted position of FIG. 3. The ITO layer could be formed before or after the semi-reflecting layer is disposed. Also, the semi-reflecting layer could be a single film or a multi-layered stack. The microcavity organic electroluminescent device could be the top emission device, the bottom emission device, the dual emission device or the inverted device, if the semi-reflecting layer is disposed in the path of light of the device, and a certain proportion of the area of the semi-reflecting layer to the area of the transparent electrode is properly presented.

While the present invention has been described by way of example and in terms of the preferred embodiment, it is to be understood that the present invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A trans-reflective organic electroluminescent panel, comprising:
    a substrate;
    a plurality of controlling components formed on the substrate;
    a plurality of displaying regions formed on the substrate and electrically connected to the controlling components, each displaying region including an organic electroluminescent device, the organic electroluminescent device comprising:
        a transparent electrode formed on a first surface of the substrate;
        a light emitting layer, formed above the transparent electrode, for generating light toward the transparent electrode;
        a reflective electrode formed above the light emitting layer; and
        a semi-reflecting layer comprising at least a metallic thin film being disposed in a path of the light, wherein the semi-reflecting layer is formed on the first surface of the substrate and covered by the transparent electrode, and an area of the semi-reflecting layer to an area of the transparent electrode is in a proportion of about 20% to about 80%.

2. The panel according to claim 1, wherein the semi-reflecting layer comprises a plurality of metallic thin films.

3. The panel according to claim 1, wherein the metallic thin film comprises silver or aluminum.

4. The panel according to claim 1, wherein the semi-reflecting layer is disposed between the substrate and the transparent electrode.

5. The panel according to claim 1, wherein the organic electroluminescent device further comprises a hole transport layer disposed between the light emitting layer and the transparent electrode.

6. The panel according to claim 5, wherein the organic electroluminescent device further comprises a hole injection layer disposed between the transparent electrode and the hole transport layer.

7. The panel according to claim 1, wherein the organic electroluminescent device further comprises an electron transport layer disposed between the reflective electrode and the light emitting layer.

8. The panel according to claim 7, wherein the organic electroluminescent device further comprises an electron injection layer disposed between the reflective electrode and the electron transport layer.

9. The panel according to claim 1, wherein the controlling components are a plurality of thin film transistors.

10. The panel according to claim 1, wherein the organic electroluminescent device further comprises a specific configuration formed by the semi-reflecting layer and the transparent electrode.

11. The panel according to claim 10, wherein the specific configuration is a pattern of slanting stripes, a dotted pattern, a web pattern, a checked pattern or a pattern of concentric frames.

12. A method of fabricating a trans-reflective organic electroluminescent panel, comprising the steps of:
    providing a substrate;
    forming a plurality of controlling components on the substrate;
    forming a plurality of displaying regions on the substrate so that the displaying regions electrically connect to the controlling components, wherein each displaying region includes an organic electroluminescent device, the steps of fabricating the organic electroluminescent device comprising:
        forming a transparent electrode on a first surface of the substrate;
        forming a light emitting layer above the transparent electrode, and the light emitting layer generating light toward the transparent electrode;
        forming a reflective electrode above the light emitting layer; and
        disposing a semi-reflecting layer comprising at least a metallic thin film in a path of the light, wherein the semi-reflecting layer is formed on the first surface of the substrate and covered by the transparent electrode, and an area of the semi-reflecting layer to an area of the transparent electrode is in a proportion of about 20% to about 80%.

13. The method according to claim 12, wherein the semi-reflecting layer is disposed between the substrate and the transparent electrode.

14. The method according to claim 12, wherein the steps of fabricating the organic electroluminescent device further comprises forming a hole transport layer between the light emitting layer and the transparent electrode.

15. The method according to claim 14, wherein the steps of fabricating the organic electroluminescent device further comprises forming a hole injection layer between the transparent electrode and the hole transport layer.

16. The method according to claim 12, wherein the steps of fabricating the organic electroluminescent device further comprises forming an electron transport layer between the reflective electrode and the light emitting layer.

17. The method according to claim 16, wherein the steps of fabricating the organic electroluminescent device further comprises forming an electron injection layer between the reflective electrode and the electron transport layer.

18. The method according to claim 12, wherein the steps of fabricating the organic electroluminescent device comprises forming a plurality of metallic thin films formed on the first surface of the substrate as the semi-reflecting layer, and forming the transparent electrode on the first surface of the substrate and covering the semi-reflecting layer.

* * * * *